US010285298B2

(12) United States Patent
Ritter et al.

(10) Patent No.: US 10,285,298 B2
(45) Date of Patent: *May 7, 2019

(54) CABLE RETAINER FOR SET TOP BOX LEAD DRESS

(71) Applicant: INTERDIGITAL CE PATENT HOLDINGS, Paris (FR)

(72) Inventors: Darin Ritter, Indianapolis, IN (US); Mickey Hunt, Camby, IN (US)

(73) Assignee: InterDigital CE Patent Holdings, Colonel Moll (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/837,844

(22) Filed: Dec. 11, 2017

(65) Prior Publication Data

US 2018/0103558 A1 Apr. 12, 2018

Related U.S. Application Data

(63) Continuation of application No. 15/033,332, filed as application No. PCT/US2014/062555 on Oct. 28, 2014, now Pat. No. 9,867,304.

(60) Provisional application No. 61/897,780, filed on Oct. 30, 2013, provisional application No. 62/005,186, filed on May 30, 2014.

(51) Int. Cl.
*H02B 1/01* (2006.01)
*H05K 7/14* (2006.01)
*H01R 13/639* (2006.01)

(52) U.S. Cl.
CPC ........... *H05K 7/14* (2013.01); *H01R 13/6395* (2013.01); *H01R 2201/06* (2013.01)

(58) Field of Classification Search
CPC ... H05K 7/14; H01R 13/6395; H01R 2201/06
USPC .................................................. 361/825–826
See application file for complete search history.

(56) References Cited

U.S. PATENT DOCUMENTS

| 5,174,293 | A | 12/1992 | Hagiwara |
| 5,769,646 | A | 6/1998 | Cavello et al. |
| 5,928,023 | A | 7/1999 | Buckner et al. |
| 6,114,622 | A | 9/2000 | Draeger |
| 6,285,565 | B1 | 9/2001 | Aberg et al. |
| 6,494,735 | B1 | 12/2002 | Chen et al. |

(Continued)

FOREIGN PATENT DOCUMENTS

| CN | 202050206 U | 11/2011 |
| DE | 19915490 A1 | 10/2000 |

(Continued)

*Primary Examiner* — Hung S. Bui
(74) *Attorney, Agent, or Firm* — Richard Laperuta; Jerome G. Schaefer

(57) ABSTRACT

An electronic device assembly includes an electronic device having a first panel and and a second panel adjacent and orthogonal to the first panel, wherein the first panel includes apertures and the second panel includes a panel jack for connecting to cables, and a cable retainer having a base and a back upstanding wall extending from the base. The base is attached to the first panel of the electronic device. The back upstanding wall faces the second panel, the back upstanding wall is spaced from the second panel, and the back upstanding wall has slots for supporting the cable, wherein the upstanding wall has a plurality of sections in which the sections are at different gaps from the second panel of the electronic device.

19 Claims, 6 Drawing Sheets

(56) References Cited

U.S. PATENT DOCUMENTS

| | | |
|---|---|---|
| 6,520,792 B2 | 2/2003 | Chen-Chiang et al. |
| 6,702,237 B2 | 3/2004 | Rubenstein et al. |
| 7,374,447 B2 | 5/2008 | Matsumoto |
| 7,455,546 B1 | 11/2008 | Yoon et al. |
| 7,867,040 B2 | 1/2011 | Yu et al. |
| 9,166,337 B2 | 10/2015 | Boswell et al. |
| 9,867,304 B2 * | 1/2018 | Ritter ................. H01R 13/6395 |
| 2005/0213295 A1 | 9/2005 | Perez et al. |
| 2013/0094171 A1 | 4/2013 | Zhou |

FOREIGN PATENT DOCUMENTS

| | | |
|---|---|---|
| JP | 2001266993 A | 9/2001 |
| JP | 20143169 A | 1/2014 |

* cited by examiner

CABLE RETAINER FOR SET TOP BOX LEAD DRESS

CROSS-REFERENCE TO RELATED APPLICATIONS

This application is a continuation of U.S. application Ser. No. 15/033,332 filed on Apr. 29, 2016, which claims the benefit, under 35 U.S.C. § 365 of International Application PCT/US2014/062555, filed Oct. 28, 2014, which was published in accordance with PCT Article 21(2) on May 7, 2015 in English and which claims the benefit of U.S. Provisional Patent Application No. 61/897,780, filed Oct. 30, 2013 and claims the benefit of U.S. Provisional Patent Application No. 62/005,186, filed May 30, 2014, which are incorporated by reference herein in its entirety.

FIELD OF THE INVENTION

The present principles relate generally to electronic devices and, more particularly, to electronic devices with a cable retainer support system.

BACKGROUND OF THE INVENTION

Consumer/market preference for set top boxes and the like (such as computers, game consoles, DVD players, CD player, etc.) is to have such devices be small/compact. However, this requirement is becoming increasingly challenging, because set top boxes and the like are required to perform more functions and interface with more devices which undoubtedly implies that they are required to contain more internal components. With these additional functionalities, more or more cables, wires, leads, etc. (which herein will be referred to as cables) must be connected to the panel jack region of the electronic device.

The presence of such a large number of the cables increases the chances that at least one of the cables will have some lateral force or strain from a force parallel to the surface of the panel jack that may (1) cause damage to the electrical connector to which the cable is connected, (2) cause damage to the cable, (3) cause damage to the panel jack in general, or (4) unintentionally disconnect cables. Further, the presence of such a large number of the cables increases the chances that at least one of the cables will likely just fall out of the electrical connector or for a cable to be inadvertently pulled out of the electrical connector.

These problems can even be enhanced by the fact that the electronic devices are getting smaller and lighter and the connectors on set top boxes and the like must accommodate several different types of cables. Some of the cables may have better retention forces than others, wherein such cables can be heavy and stiff and are vulnerable to accidental disconnection.

One proposed solution to preventing the problem of cable disconnecting is to have connector vendors increase the friction on the connectors with spring fingers. However, this solution still jeopardizes the panel jack, the connectors and the cables if there is some lateral force on the cables.

As such, a need exists to safely secure cables to a panel jack to prevent damage to the electrical connector, the panel jack, and the cables, and also prevent the inadvertent disconnection of cables.

SUMMARY OF THE INVENTION

To address the above problem without the need to redesign the electronic device, a plastic piece having hooks that snap into slot details on the bottom of an electronic device such as a set top box is provided. This results in the electronic device being able to remain small and light without the need to add additional bulk to casings. The piece includes a proliferation of tabs that cradle the cables plugged into the back of the box and provide retention force to keep the cables from unplugging accidentally or from bending from side to side.

BRIEF DESCRIPTION OF THE DRAWINGS

The invention will be explained in greater detail in the following with reference to embodiments, referring to the appended drawings, in which.

DETAILED DESCRIPTION OF THE INVENTION

To aid in preventing accidental disconnection and to prevent damage, a retainer is disclosed that comprises of a plastic piece that has hooks that snap into slot details on the bottom of a set top box or electronic device and a proliferation of tabs that cradle the cables plugged into the back of the set top box. Many different configurations of the snaps are possible; however two examples are shown in FIG. 1.

The cables can fit into slots in the tabs and the overmolds on the cables are captured by the tabs on the retainer. The assembly of the retainer to the set top box is stabilized by the retainer being captured between the set top box and the mounting surface on which the electronic device assembly 30 which includes the electronic device 1 and the cable retainer 5.

Figure 1:
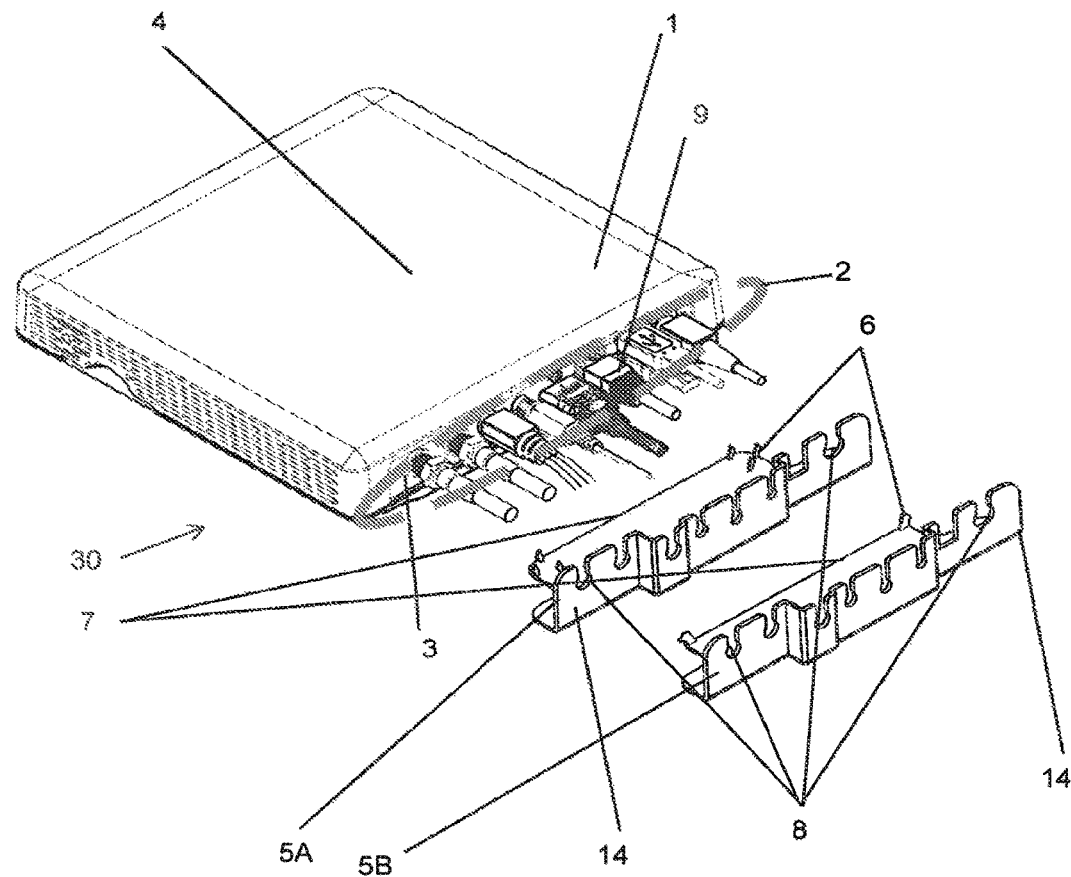
FIG. 1 is a top perspective view of a partially disassembled set top box assembly 30 according to the invention.

FIG. 1 shows the set top box assembly 30 that includes a panel jack 2 and a cable retainer 5A or 5B that connect to the set top box 1. The cable retainer holds cables 9 by a series of tabs or slots 8 on the cable retainer 5A, 5B to prevent the cables from damaging or to prevent the panel jack from being damaged. In this figure, cable retainer 5A is one possible cable retainer and cable retainer 5B is another possible cable retainer. The difference between cable retainers 5A and 5B is the number and types of connectors or snaps 6 that they have. Although the cable retainers 5A has 6 snaps 6 and the retainer 5B has 2, other numbers and styles of snaps and connectors are within the scope of the invention. This view also shows the set top box 1 including a casing that has a back side 3 to which the panel jack 2 and the cable retainer 5 are located and a top 4. A plurality of cables 9 is shown being connected to corresponding electrical connectors on the panel jack and the cable retainers 5A, 5B are shown having tabs or slots 8 that each cradle a respective cable 9 when the snaps 6 on base 7 of the retainer 5A, 5B engage the bottom of the set top box.

Figure 2:
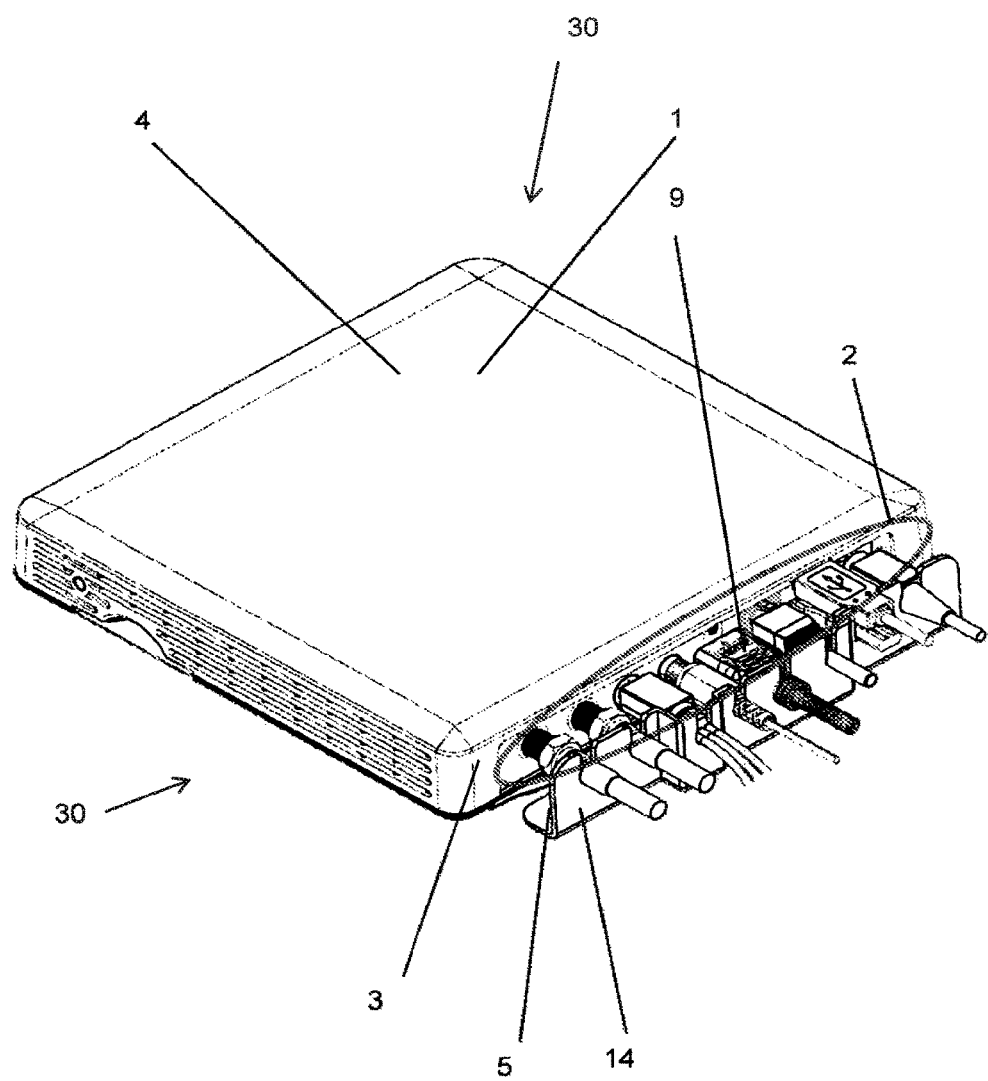
FIG. 2 is a top perspective view of the assembled set top box assembly 30 according to the invention.

FIG. 2 shows a perspective view of the assembled set top box assembly 30 according to the invention. In this view, the plurality of cables 9 are shown being cradled in respective snaps or slots 6 on back upstanding wall 14 of the retainer 5.

Figure 3:
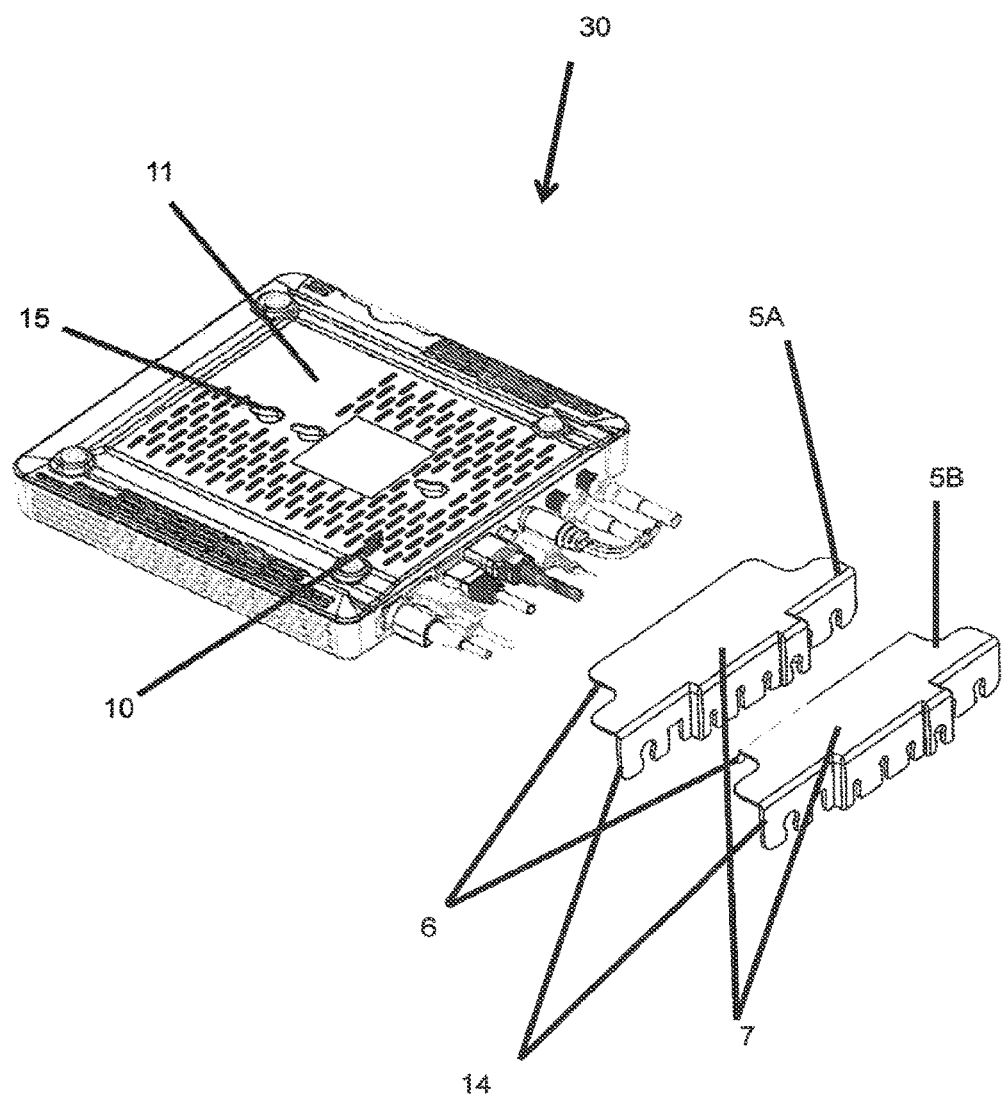
FIG. 3 is a bottom perspective view of a partially disassembled set top box assembly 30 according to the invention.

FIG. 3 shows the bottom 11 of the set top box 1. This view shows apertures 10 into which the snaps 6 of the cable retainer 5 are snapped into or hooked into to hold the cable retainer 5. The apertures can be part of a collection of vents for heat dissipation of the set top box 1. This view further shows that the bottom 11 can include keyhole or wall mounting holes 15 to hang or secure the electronic device assembly 30 on a surface or wall that has screw heads or hooks or the like (not shown).

Figure 4:
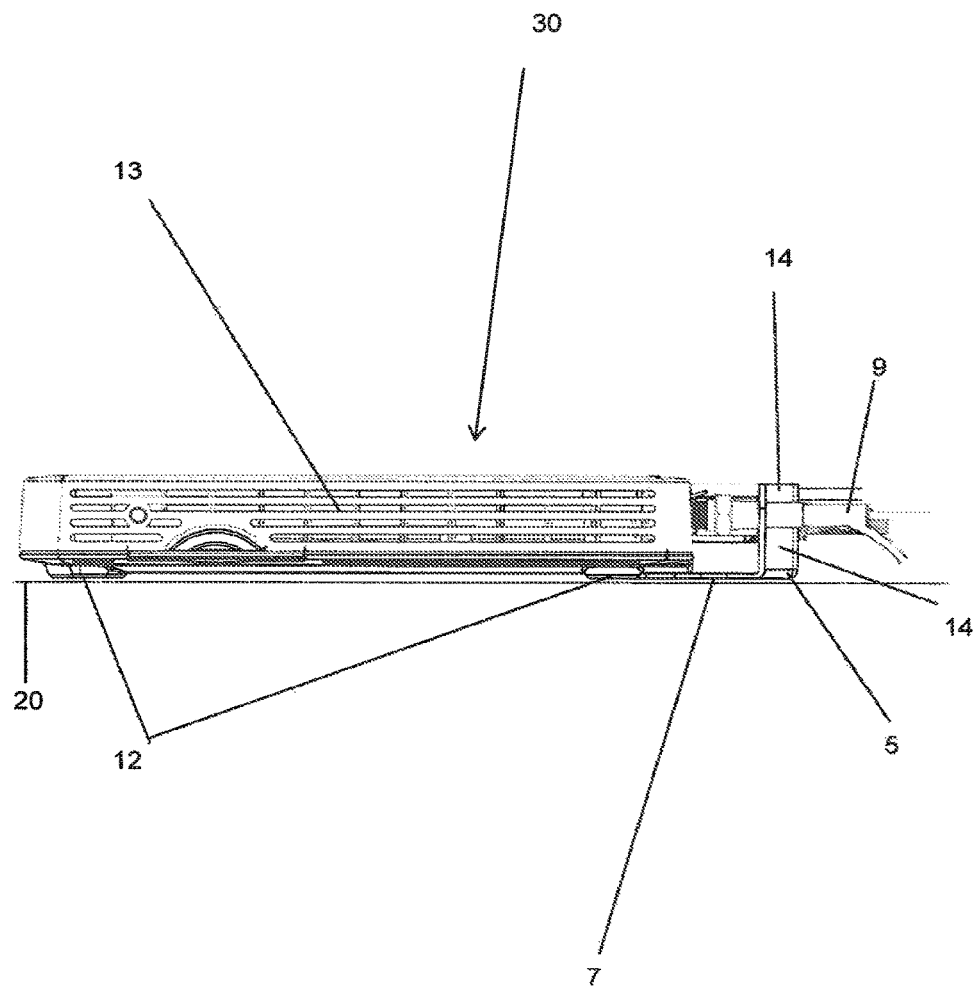
FIG. 4 is a side plan view of the assembled set top box assembly 30 according to the invention.

FIG. 4 shows a side view of the assembled set top box assembly 30 on a mounting surface 20 according to the invention. The mounting surface 20 is either a table top or a wall having the screw heads or hooks or the like that would engage the mounting holes 15 shown in FIG. 3. Feet 12 of the set top box 1 permit the set top box 1 to be elevated to permit heat to escape or dissipate from the device through the apertures 10 in the bottom 11. The feet 12 can also elevate the set top box 1 over the mounting surface 20 to provide clearance for the base 7 of the retainer 5. The device can include side wall vents 13 on a side of device for further heat dissipation as shown in FIG. 4.

The cable retainer 5 can be plastic such that the retainer is flexible enough that the tabs can be flexed to allow for the plugging and unplugging of the individual cables.

Figure 5:
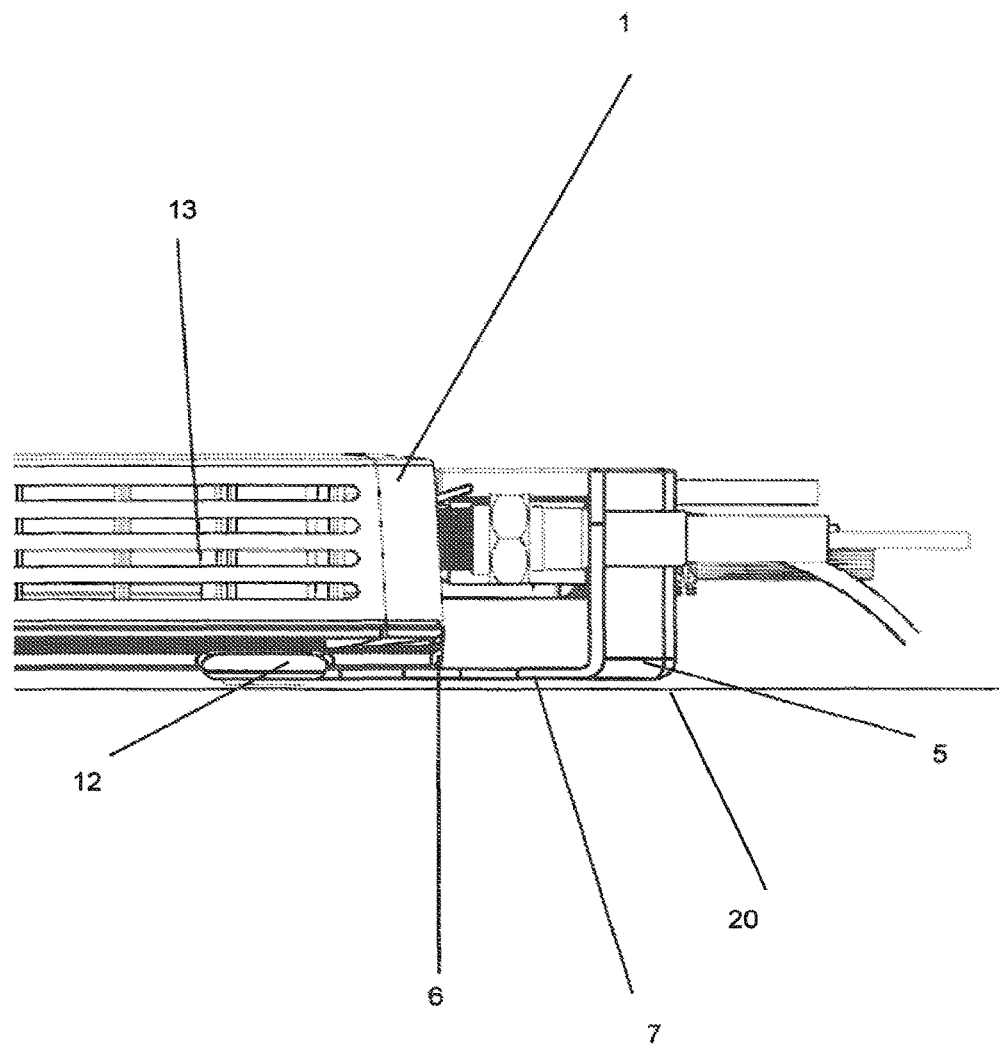
FIG. 5 is a magnified plan side view of the assembled set top box assembly 30 according to the invention.

FIG. 5 shows magnified side view of the assembled set top box assembly 30 on a mounting or support surface 20. This view shows at least one of snaps 6 engaged in an aperture 10 at the edge of the set top box 1.

Figure 6:
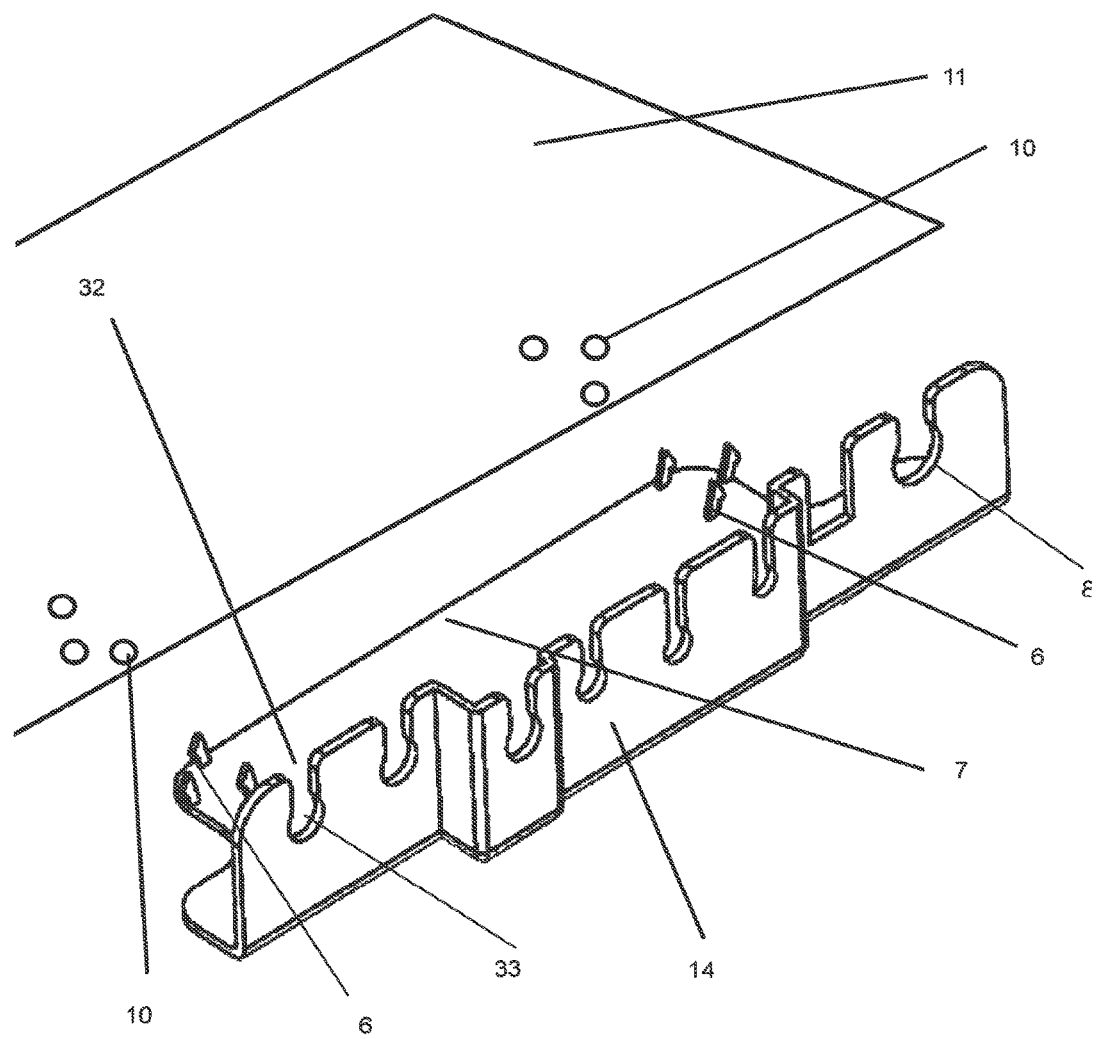
FIG. 6 is a perspective view of the cable retainer 5 and the bottom 11 of the set top box 1 according to the invention.

FIG. 6 highlights the connection features or snaps 6 and only the corresponding specific apertures 10 in bottom 11 that secure the retainer 5 to the set top box 1. In one embodiment, the connection features 6 are elastic elongated protrusion and can be generally angled in which they can be angled toward an adjacent edge of the base 7 on which they sit. These connection features 6 can include a ledge portion and this ledge portion can face the adjacent edge of the base 7. The ledge portions of the connection features 6 can grasp the inner surface of the bottom 11 around the respective apertures 10 such that the bottom surface of the ledge portion of the snaps 6 and the top surface of the base 7 sandwich the bottom 11 to secure retainer to the set top box. The connection features 6 can further include an angle edge that slopes down toward the end of the ledge portion which enables the connection features 6 to be squeezed and/or elastically snapped into to the respective apertures 10.

In particular, FIG. 6 shows the connection features 6 of retainer 5A; however, the connection features 6 of retainer 5B in FIG. 1 are applicable for the attachment in which a single connection feature 6 is present at each edge of the base. The connections features in retainer 5B can work in the same manner as in retainer 5A. The preference for the number and spacing of the connection features 6 can be dependent on the size of the set top box, the number of cables, and the level of stability and support needed for the cables. As a practical manner, less connection features makes it easier to disconnect the retainer 5.

FIG. 6 also shows that the slots 8 can have entry portions 32 that lead to cable support portions 33. In this embodiment, the entry portions 32 are narrower than the large horizontal dimension cable support portions 33. With this configuration, the cables 9 are more securely connected to the electronic device 1.

In sum, the figures show an electronic device assembly 30 such as a set top box assembly that can include cables 9 connected to a panel jack 2 and a cable retainer 5. The device can have a series of apertures 10 on the bottom 11 of the device 1 that can serve as heat dissipation vents and cable retainer support apertures to receive snaps 6 of the cable retainer 5. Additional apertures 15 on the bottom 11 can be provided for mounting the device on a wall 20. The device 1 can have a side such as a back side 3 for supporting the panel jack 2 having electrical connectors for cable connecting heads of cables 9 to which the heads connect. The cable retainer 5 can have a generally planer base 7 parallel to the bottom 11 and a back upstanding wall 14 extending from the base 7 and being at an angle from the base which is preferably 90 degrees. The back upstanding wall 14 when the retainer is attached forms a gap with the back side 3 of the device to accommodate the cable connecting heads of the cables. The back upstanding wall 14 includes slots or tab 8 which can be narrowed at the top to permit the cable to snap into the slot or tab 8 for supporting the generally flexible cable wire portion of the cables that connect to the heads. Also, extending from the planer base 7 are a plurality of the snaps or hooks 6 which are designed to snap into or grasp at least some of the apertures 10, thereby supporting at least in part the retainer 5. Feet 12 can be provided to the support the set top box 1. The feet 12 can provide enough height to permit the base 7 to fit in between a planar supporting surface 20 and the bottom 11 that is parallel to the planar supporting surface 20. The base 7 can be parallel to the bottom 11 and can touch either the supporting surface 20 or the bottom 11 or both for additional support.

An advantageous feature of the cable retainer 5 is that the attachment and detachment motion from the electronic device is generally a vertical motion which enables the cable retainer 5 to be removed without unplugging the cables and which enables the attachment of the cable retainer to mate with the cables already connected to the panel jack. In other words, the detachment motion is perpendicular to the cables at their attachment locations at the panel jack.

Another advantage of the invention is that the set top box manufacturer will know the kinds and types of cables that will plug into the respective panel jacks. As such, the retainer, which is preferably a molded plastic part, can be easily molded by the retainer manufacture to have a design/shape which is specifically commensurate for the specific geometry of the cable grouping called for by any specific set top box. Thus, the set top box manufacturer/supplier can have specific types of retainers made and stocked to easily accommodate the different cable groups needed for the different set top box designs. In other words, the invention lends itself to having the retainers easily customized.

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An electronic device assembly comprising:
   an electronic device having a first panel and a second panel adjacent and orthogonal to the first panel, wherein the first panel includes apertures and the second panel includes a panel jack for connecting to cables; and a cable retainer having a base and an upstanding wall that is adjacent to and extending from the base, the base being attached to the first panel of the electronic device, the upstanding wall facing the second panel, the upstanding wall being spaced from the second panel, and the upstanding wall having slots for supporting the cables;

wherein the upstanding wall has a plurality of sections in which the sections are at different gaps from the second panel of the electronic device.

2. The electronic device assembly of claim 1 further comprising connection features on the base that attach the base to the first panel of the electronic device.

3. The electronic device assembly of claim 2, wherein the connection features are snaps that connect to the base to the first panel through apertures in the first panel of the electronic device.

4. The electronic device assembly of claim 2 further comprising feet that elevate the first panel of the electronic device over a mounting surface to provide clearance for the base of the cable retainer.

5. The electronic device assembly of claim 4, wherein the snaps comprise ledges that grasp inner portions of the first panel of the electronic device through the apertures in the first panel of the electronic device.

6. The electronic device assembly of claim 1 further comprises a gap between the second panel of the electronic device and the upstanding wall of the cable retainer that provides clearance for cable connecting heads of the cables, wherein the upstanding wall is parallel to the second panel.

7. The electronic device assembly of claim 1 further comprising a gap between the second panel of the electronic device and the adjacent upstanding wall of the cable retainer that provides clearance for cable connecting heads of the cables, wherein the upstanding wall is parallel to the second panel and the slots are formed to receive and support flexible cable wire portions of the cables that connect to the cable connecting heads which plug into the panel jack.

8. The electronic device assembly of claim 7, wherein the slots have entry portions that lead to cable support portions, wherein the entry portions are narrower than the cable support portions.

9. The electronic device assembly of claim 8 further comprising a gap between the second panel of the electronic device and the upstanding wall of the cable retainer that provides clearance for cable connecting heads of the cables, wherein the upstanding wall is parallel to the second panel and the slots are formed to receive and support flexible cable wire portions of the cables that connect to the cable connecting heads which plug into the panel jack.

10. The electronic device assembly of claim 1 wherein the cable retainer is connected to and removed from the electronic device assembly while one or more cables are connected to the panel jack.

11. The electronic device assembly of claim 1, wherein a plurality of cable retainers are respectively customized for use with a plurality of different predetermined groupings of cables connectable to the electronic device assembly.

12. A cable retainer for an electronic device assembly comprising:

a base, and an upstanding wall extending from and orthogonal to the base;

wherein the base has connection features for attaching the cable retainer to the electronic device and the upstanding wall has slots for supporting cables that connect to the electronic device;

wherein the connection features are snaps for connecting the base to a first panel of the electronic device through apertures in the first panel of the electronic device;

wherein the snaps are positioned from the upstanding wall such that a gap between a second panel of the electronic device and the upstanding wall is formed that provides clearance for cable connecting heads of the cables when the base is attached to the first panel of the electronic device; and wherein the upstanding wall has a plurality of sections in which the sections are parallel to one another such that the different sections have different gaps from the second panel of the electronic device.

13. The cable retainer of claim 12, wherein the second panel is adjacent to and orthogonal to the first panel.

14. The cable retainer of claim 12, wherein the upstanding wall is parallel to the second panel and the slots are formed to receive and support flexible cable wire portions of the cables that connect to the cable connecting heads which plug into a panel jack on the second panel of the electronic device.

15. The cable retainer of claim 12, wherein the slots have entry portions that lead to cable support portions, wherein the entry portions are narrower than the cable support portions.

16. The cable retainer of claim 12, wherein the snaps comprise ledges that grasp inner portions of the first panel of the electronic device through the apertures in the first panel of the electronic device.

17. The cable retainer of claim 12, wherein the cable retainer is connected to and removed from the electronic device assembly while one or more cables are connected to the panel jack.

18. The cable retainer of claim 17, wherein the cable retainer is removed from the electronic device assembly using a detachment motion perpendicular to the cables at attachment locations.

19. The cable retainer of claim 12, wherein the cable retainer is customized for use with a predetermined grouping of cables connectable to the electronic device assembly.

* * * * *